United States Patent
Olsen et al.

(10) Patent No.: US 9,870,921 B2
(45) Date of Patent: Jan. 16, 2018

(54) CLEANING METHOD (71) Applicant: Applied Materials, Inc., Santa Clara, CA (US)

(72) Inventors: Christopher S. Olsen, Fremont, CA (US); Peter Stone, Los Gatos, CA (US); Teng-fang Kuo, San Jose, CA (US); Ping Han Hsieh, San Jose, CA (US); Manoj Vellaikal, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/259,489

(22) Filed: Sep. 8, 2016

(65) Prior Publication Data

US 2017/0084456 A1 Mar. 23, 2017

Related U.S. Application Data (60) Provisional application No. 62/222,097, filed on Sep. 22, 2015, provisional application No. 62/232,810, filed on Sep. 25, 2015.

(51) Int. Cl.
*H01L 21/3065* (2006.01)
*H01L 21/02* (2006.01)
(Continued)

(52) U.S. Cl.
CPC .... *H01L 21/02658* (2013.01); *H01L 21/0206* (2013.01); *H01L 21/0262* (2013.01); *H01L 21/02381* (2013.01); *H01L 21/02521* (2013.01); *H01L 21/02532* (2013.01); *H01L 21/3065* (2013.01); *H01L 21/6719* (2013.01); *H01L 21/67167* (2013.01); *H01L 21/67184* (2013.01);
(Continued)

(58) Field of Classification Search
CPC .......... H01L 21/0206; H01L 21/02532; H01L 21/0262; H01L 21/02658; H01L 21/3065; H01L 21/67167; H01L 21/67173
See application file for complete search history.

(56) References Cited

U.S. PATENT DOCUMENTS

| | | |
|---|---|---|
| 4,579,609 A | 4/1986 | Reif et al. |
| 6,042,654 A | 3/2000 | Comita et al. |

(Continued)

FOREIGN PATENT DOCUMENTS

JP 2012004272 A 1/2012

OTHER PUBLICATIONS

International Search Report and Written Opinion in International Application No. PCT/US2016/051487 dated Dec. 20, 2016.

*Primary Examiner* — Daniel Shook
(74) *Attorney, Agent, or Firm* — Patterson + Sheridan LLP (57) ABSTRACT

Implementations of the present disclosure generally relate to methods and apparatuses for epitaxial deposition on substrate surfaces. More particularly, implementations of the present disclosure generally relate to methods and apparatuses for surface preparation prior to epitaxial deposition. In one implementation, a method of processing a substrate is provided. The method comprises etching a surface of a silicon-containing substrate by use of a plasma etch process, where at least one etching process gas comprising chlorine gas and an inert gas is used during the plasma etch process and forming an epitaxial layer on the surface of the silicon-containing substrate.

20 Claims, 7 Drawing Sheets

(51) Int. Cl.
*H01L 21/67* (2006.01)
*H01L 21/687* (2006.01)

(52) U.S. Cl.
CPC .. *H01L 21/68742* (2013.01); *H01J 2237/334* (2013.01)

(56) References Cited

U.S. PATENT DOCUMENTS

| | | |
|---|---|---|
| 6,187,682 B1 | 2/2001 | Denning et al. |
| 8,501,629 B2 | 8/2013 | Tang et al. |
| 8,741,778 B2 | 6/2014 | Yang et al. |
| 9,064,816 B2 | 6/2015 | Kim et al. |
| 9,093,390 B2 | 7/2015 | Wang et al. |
| 2007/0181057 A1* | 8/2007 | Lam .................. C23C 16/0236 117/92 |
| 2009/0017603 A1* | 1/2009 | Yang .................. H01L 21/0206 438/503 |
| 2010/0178600 A1 | 7/2010 | Chandrachood et al. |
| 2010/0273290 A1 | 10/2010 | Kryliouk |
| 2012/0178259 A1 | 7/2012 | Miyazaki et al. |
| 2014/0232263 A1 | 8/2014 | Nguyen et al. |
| 2015/0040822 A1 | 2/2015 | Olsen et al. |
| 2015/0050753 A1 | 2/2015 | Srinivasan et al. |
| 2015/0170935 A1 | 6/2015 | Wang et al. |

\* cited by examiner

CLEANING METHOD

CROSS-REFERENCE TO RELATED APPLICATIONS

This application claims benefit of priority to U.S. provisional patent application Ser. No. 62/222,097, filed Sep. 22, 2015, and U.S. provisional patent application Ser. No. 62/232,810, filed Sep. 25, 2015. Both of the aforementioned applications are incorporated herein by reference in their entirety.

BACKGROUND

Field

Implementations of the present disclosure generally relate to methods and apparatuses for epitaxial deposition on substrate surfaces.

Description of the Related Art

Integrated circuits are formed in and on silicon and other semiconductor substrates. In the case of single crystal silicon, substrates are made by growing an ingot from a bath of molten silicon, and then sawing the solidified ingot into multiple wafers. An epitaxial silicon layer may then be formed on the monocrystalline silicon wafer to form a defect-free silicon layer that may be doped or undoped. Semiconductor devices, such as transistors, are manufactured from the epitaxial silicon layer. The electrical properties of the formed epitaxial silicon layer will generally be better than the properties of the monocrystalline silicon substrate.

Surfaces of the monocrystalline silicon and the epitaxial silicon layer are susceptible to contamination when exposed to typical wafer fabrication facility ambient conditions. For example, a native oxide layer may form on the monocrystalline silicon surface prior to deposition of the epitaxial layer. Additionally, contaminants present in the ambient environment may deposit on the monocrystalline surface. The presence of a native oxide layer or contaminants on the monocrystalline silicon surface negatively affects the quality of an epitaxial layer subsequently formed on the monocrystalline surface. While present cleaning methods remove some of the native oxides and contaminants from the monocrystalline silicon surface, some contaminants still remain.

Therefore, there is a need for a method and apparatus for cleaning a substrate surface, especially for cleaning a substrate surface prior to performing an epitaxial deposition process.

SUMMARY

Implementations of the present disclosure generally relate to methods and apparatuses for epitaxial deposition on substrate surfaces. More particularly, implementations of the present disclosure generally relate to methods and apparatuses for surface preparation prior to epitaxial deposition. In one implementation, a method of processing a substrate is provided. The method comprises etching a surface of a silicon-containing substrate by use of a plasma etch process, where at least one etching process gas comprising chlorine gas and an inert gas is used during the plasma etch process and forming an epitaxial layer on the surface of the silicon-containing substrate. The inert gas is selected from argon, helium, or both. In one implementation, the plasma etch process utilizes an inductively coupled plasma etch process. In one implementation, the method further comprises removing oxides from the surface of the silicon-containing substrate by a cleaning process prior to etching the surface of the silicon-containing substrate. In one implementation, the cleaning process is selected from $NF_3/NH_3$ plasma-based processes, hydrofluoric ("HF")/$NH_3$ based processes, wet-HF processes, or $NF_3/NH_3$ inductively coupled plasma processes. In one implementation, the etching the surface of the silicon-containing substrate and forming an epitaxial layer on the surface of the silicon-containing substrate are performed without exposing the substrate to atmosphere.

In another implementation, a method of processing a substrate is provided. The method comprises removing oxides from a surface of a silicon containing substrate positioned in a first substrate-processing region by a cleaning process. The cleaning process is selected from a wet etch process, a first plasma etch process, and a sputter etch process. The method further includes etching the surface of the silicon-containing substrate positioned in a second substrate-processing region by use of a second plasma etch process, where at least one etching process gas comprising chlorine gas and an inert gas is used during the plasma etch process and forming an epitaxial layer on the surface of the silicon-containing substrate. The inert gas is selected from argon, helium, or both.

In yet another implementation, a method of processing a substrate is provided. The method comprises etching a surface of a silicon-containing substrate positioned in a substrate-processing region of a first processing chamber by use of a plasma etch process, where at least one etching process gas comprising chlorine gas and an inert gas is used during the plasma etch process. The inert gas is selected from argon, helium, or both. The method further includes transferring the silicon-containing substrate from the first processing chamber to a second processing chamber after the plasma etch process without exposing the substrate to atmosphere between the etching the surface and the forming the epitaxial layer and forming an epitaxial layer on the surface of the silicon-containing substrate in the second processing chamber.

BRIEF DESCRIPTION OF THE DRAWINGS

So that the manner in which the above-recited features of the present disclosure can be understood in detail, a more particular description of the implementations, briefly summarized above, may be had by reference to implementations, some of which are illustrated in the appended drawings. It is to be noted, however, that the appended drawings illustrate only typical implementations of this disclosure and are therefore not to be considered limiting of its scope, for the disclosure may admit to other equally effective implementations.

To facilitate understanding, identical reference numerals have been used, where possible, to designate identical elements that are common to the figures. It is contemplated that elements and features of one implementation may be beneficially incorporated in other implementations without further recitation. It is to be noted, however, that the appended drawings illustrate only exemplary implementations of this disclosure and are therefore not to be considered limiting of its scope, for the disclosure may admit to other equally effective implementations.

DETAILED DESCRIPTION

The following disclosure generally describes methods and apparatuses for epitaxial deposition on substrate surfaces. Certain details are set forth in the following description and in FIGS. 1-7 to provide a thorough understanding of various implementations of the disclosure. Other details describing well-known structures and systems often associated with epitaxial deposition and surface preparation of substrate are not set forth in the following disclosure to avoid unnecessarily obscuring the description of the various implementations.

Many of the details, dimensions, angles and other features shown in the Figures are merely illustrative of particular implementations. Accordingly, other implementations can have other details, components, dimensions, angles and features without departing from the spirit or scope of the present disclosure. In addition, further implementations of the disclosure can be practiced without several of the details described below.

Native oxides present on silicon-containing surfaces prior to processing and oxygen contaminants that contaminate the silicon-containing surface during processing affect the quality of subsequently deposited epitaxial layers and the final formed device. Implementations of the present disclosure provide systems and methods for reducing native oxides and oxygen contaminants present during device formation. In one implementation of the present disclosure methods of pre-cleaning a silicon-containing substrate prior to epitaxial deposition, which results in deposition of an improved epitaxial material are provided. It has been found by the inventors that clustering processing chambers through vacuum transfer reduces exposure to atmosphere and correspondingly reduces exposure to oxygen contaminants. For example, performing inductively coupled plasma chlorine etching of silicon prior to epitaxial deposition without breaking vacuum between etching and deposition reduces exposure to oxygen contaminants. In some implementations, a native oxide removal process (e.g., capacitively coupled plasma using $NH_3/NF_3$; inductively coupled plasma using $NH_3/NF_3$; chemical oxide removal—thermal combination of anhydrous $HF+NH_3$; or exposure to aqueous HF) is performed followed by a silicon-etching process (e.g., ICP $H_2/Cl_2$ silicon etching) and an epitaxial deposition process. Since most native oxide removal processes are unstable and native oxide starts regrowing on the silicon-containing surface upon exposure to atmosphere, clustering the native oxide removal chamber along with the etching of silicon and epitaxial deposition also leads to a reduction in oxygen contaminants.

Implementations described herein will be described below in reference to cleaning, etching and deposition processes that can be carried out using systems available from Applied Materials, Inc. of Santa Clara, Calif. Other tools capable of performing these cleaning, etching and deposition processes may also be adapted to benefit from the implementations described herein. In addition, any system enabling the cleaning, etching and deposition processes described herein can be used to advantage. The apparatus description described herein is illustrative and should not be construed or interpreted as limiting the scope of the implementations described herein.

Figure 1:
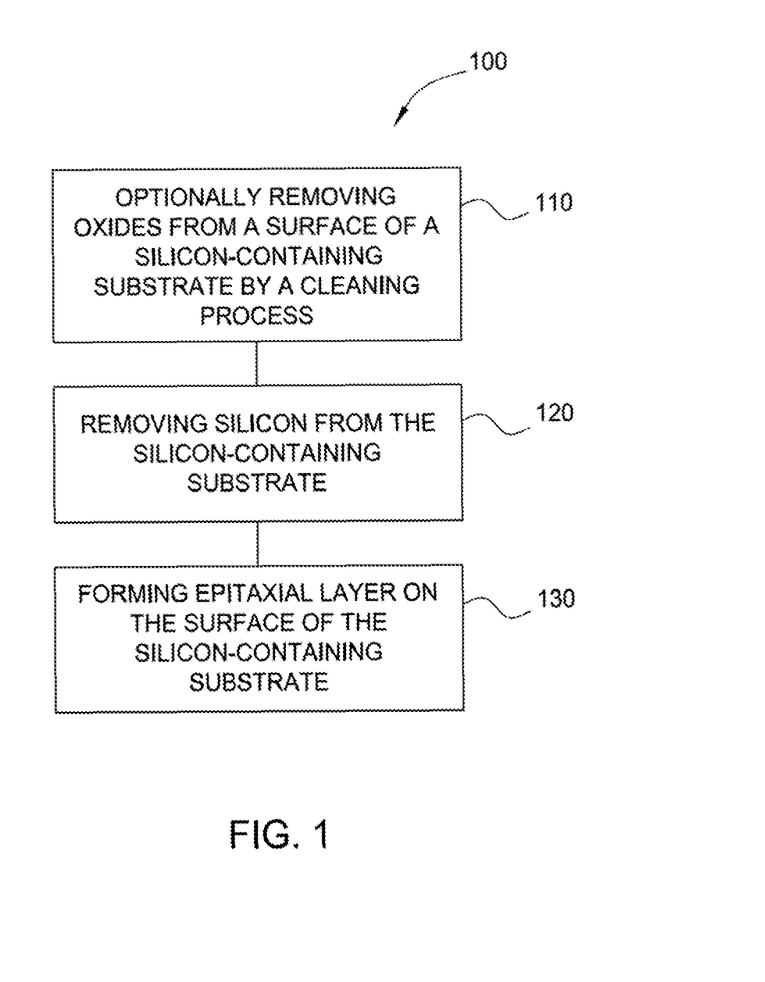
FIG. 1 is a flow chart illustrating a processing sequence in accordance with one implementation of the present disclosure.

FIG. 1 illustrates a processing sequence 100 in accordance with one implementation of the present disclosure. Optionally, the processing sequence 100 begins at operation 110. In operation 110, native oxides on a surface of a substrate are removed by a cleaning process. The substrate may include a silicon-containing material and the surface may include a material, such as silicon (Si), germanium (Ge) or silicon germanium alloys (SiGe). In some implementations, the Si, Ge, or SiGe surface may have an oxide layer, such as native oxide layer, disposed thereon. The substrate may be a semiconductor substrate with devices formed thereon.

In one implementation, operation 110 is performed in a processing region of a first processing chamber. In one implementation, the first processing chamber is positioned on a cluster tool allowing for transfer of the substrate without exposing the substrate to atmosphere (e.g., in a vacuum environment.) In another implementation, the first processing chamber is separate from the cluster tool such that the substrate is exposed to atmosphere during removal and/or transfer of the substrate.

Any suitable cleaning process that removes oxides from the substrate without significantly damaging the substrate may be used. Suitable cleaning processes include sputter etch processes, plasma etch processes, wet etch processes, or combinations thereof. Exemplary wet etch processes include wet etch processes using hydrofluoric acid (HF). Exemplary cleaning processes include $NF_3/NH_3$ plasma-based processes, hot hydrofluoric ("HF")/$NH_3$ based processes, wet HF processes, or $NF_3/NH_3$ inductively coupled plasma processes.

In one implementation, the plasma etch process involves the simultaneous exposure of a substrate to $NF_3$ and $NH_3$ plasma by-products. The plasma etch process may be a capacitively coupled plasma (CCP) process or an inductively couple plasma (ICP) process. In one implementation, the plasma etch process is a remote plasma assisted dry etch process which involves the simultaneous exposure of a substrate to $NF_3$ and $NH_3$ plasma by-products. In one example, the plasma etch process may be similar to or may include a SiCoNi™ etch process that is available from Applied Materials, Inc. of Santa Clara, Calif. In some configurations, using remote plasma excitation of the gas species allows substrate processing without plasma damage. The remote plasma etch can be largely conformal and selective towards silicon oxide layers, and thus does not readily etch silicon regardless of whether the silicon is amorphous, crystalline or polycrystalline. The remote plasma process will generally produce solid by-products, which grow on the surface of the substrate as substrate material is removed. The solid by-products can be subsequently removed via sublimation when the temperature of the substrate is raised. The plasma etch process results in a substrate surface having silicon-hydrogen (Si—H) bonds thereon. The plasma process may be a capacitively coupled plasma process or an inductively coupled plasma process.

In one implementation, the plasma etch process is a capacitively coupled plasma (CCP) process. In one implementation, the plasma etch process may include an $NF_3$ flow rate within a range of about 1 sccm to about 20 sccm, such as about 5 sccm, as well as an $NH_3$ flow rate within a range of about 50 sccm to about 200 sccm, such as about 100 sccm. In one implementation, the plasma etch process may further include an inert gas (argon, helium, or both argon and helium) at an inert gas flow rate within a range of between about 100 sccm and about 1,000 sccm (e.g., between about 200 sccm and about 500; between about 300 sccm and about 400 sccm). The plasma etch process may be performed at a pressure of between about 1 Torr and about 10 Torr (e.g., between about 2 Torr and about 5 Torr, between about 4 Torr and about 5 Torr; or about 5 Torr). The plasma etch process may be performed at an RF power setting of between about 20 Watts and about 50 Watts (e.g., between about 20 Watts to about 40 Watts; between about 25 Watts to about 35 Watts, or about 30 Watts), which may be utilized to ionize the $NF_3$ and the $NH_3$. By-products may then be sublimated from the surface of the substrate by annealing the substrate at a temperature of about 120 degrees Celsius or more for about 5 seconds to about 100 seconds, such as about 60 seconds. Other implementations of fluorine based cleaning involve, reacting $NH_3$ gas and $F_2$ or anhydrous HF gas in either plasma or thermal heat to etch $SiO_2$ native oxides. Examples of gas flow ratios would be between 1:1 to 1:20 gas flow ratio of fluorine gas to $NH_3$ gas (between 1:1 to 10:1 gas flow ratio of $NF_3$ to $NH_3$ gas; between 3:1 to 20:1 gas flow ratio of $NF_3$ to $NH_3$ gas; or between 3:1 to 10:1 gas flow ratio of $NF_3$ to $NH_3$ gas) at temperatures of 15 degrees Celsius to 130 degrees Celsius (e.g., 20 degrees Celsius to 100 degrees Celsius).

In another implementation, the plasma etch process is an inductively coupled plasma process. The inductively coupled plasma etch process includes an $NF_3$ flow rate within a range of about 1 sccm to about 20 sccm, such as about 5 sccm, as well as an $NH_3$ flow rate within a range of about 50 sccm to about 200 sccm, such as about 100 sccm. In one implementation, the inductively coupled plasma etch process may further include an inert gas (argon, helium, or both argon and helium) at an inert gas flow rate within a range of between about 500 sccm and about 10,000 sccm (e.g., between about 1,000 sccm and about 5,000; or between about 1,000 sccm and about 2,000 sccm). The plasma etch process may be performed at a pressure of between about 100 mTorr and about 500 mTorr (e.g., between about 200 mTorr and about 500 mTorr, between about 400 mTorr and about 500 mTorr; or about 500 mTorr). The plasma etch process may be performed at an RF power setting of between about 100 Watts and about 500 Watts (e.g., between about 200 Watts to about 400 Watts; between about 250 Watts to about 350 Watts, or about 300 Watts), which may be utilized to ionize the $NF_3$ and the $NH_3$. By-products may then be sublimated from the surface of the substrate by annealing the substrate at a temperature of about 120 degrees Celsius or more for about 5 seconds to about 100 seconds, such as about 60 seconds. Examples of gas flow ratios would be between 1:1 to 1:20 gas flow ratio of $NF_3$ gas to $NH_3$ gas (between 1:1 to 10:1 gas flow ratio of $NF_3$ to $NH_3$ gas; between 3:1 to 20:1 gas flow ratio of $NF_3$ to $NH_3$ gas; or between 3:1 to 10:1 gas flow ratio of $NF_3$ to $NH_3$ gas) at temperatures of 0 degrees Celsius to 50 degrees Celsius (e.g., 20 degrees Celsius to 40 degrees Celsius).

In another implementation, the cleaning process is a chemical oxide removal process including treatment with thermal $NH_3$ and anhydrous hydrofluoric acid (HF). The chemical oxide removal process may be performed at a pressure of between about 100 mTorr and about 2,000 mTorr (e.g., between about 200 mTorr and about 1,000 mTorr, between about 400 mTorr and about 500 mTorr; or about 500 mTorr). Examples of flow ratios would be between 1:1 to 1:10 flow ratio of $NH_3$ gas to anhydrous HF (between 1:1 to 5:1 gas flow ratio of $NH_3$ to anhydrous HF; or between 1:1 to 2:1 flow ratio of $NH_3$ to anhydrous HF) at temperatures of 0 degrees Celsius to 100 degrees Celsius (e.g., 20 degrees Celsius to 40 degrees Celsius). In one implementation, the chemical oxide removal process may further include an inert gas (argon, helium, nitrogen or combinations thereof) at an inert gas flow rate within a range of between about 500 sccm and about 10,000 sccm (e.g., between about 1,000 sccm and about 5,000; or between about 1,000 sccm and about 2,000 sccm).

In another implementation, the substrate is exposed to a wet clean process. The substrate may be cleaned using a wet cleaning process in which a cleaning solution, such as a HF-last type cleaning solution, ozonated water cleaning solution, hydrofluoric acid (HF) and hydrogen peroxide ($H_2O_2$) solution, or other suitable cleaning solution. The cleaning solution may be heated.

In another implementation, a different cleaning process may be utilized to clean the substrate surface. In one implementation, plasma containing Ar and $NF_3$ is introduced into the processing chamber. In another implementation, a remote plasma containing He and $NF_3$ is introduced into a processing chamber through a gas distribution plate, such as a showerhead. $NH_3$ may be directly injected into the chamber via a separate gas inlet.

In one implementation, after operation 110, the substrate is removed from the first processing chamber and transferred to a second processing chamber where operation 120 is performed. In one implementation, operation 120 is performed in a processing region of the second processing chamber. In one implementation, both operation 110 and operation 120 are performed in the same processing chamber. In one implementation, the second processing chamber is positioned on a cluster tool allowing for transfer of the substrate without exposing the substrate to atmosphere (e.g., in a vacuum environment.)

At operation 120, silicon is removed from the silicon-containing substrate. Any suitable process may be used to remove silicon from the silicon-containing substrate. In one implementation, the silicon is removed from the silicon-containing substrate using a silicon etching process. The silicon etching process may be a plasma-based etching process. The plasma-based etching process may be a capacitively coupled plasma process or an inductively coupled plasma process. In one implementation, the silicon etching process may be an over-etching process to enhance the surface of the substrate.

During the plasma-based etching process, an etching process gas is introduced into the chamber. The etching process gas may comprise one or more etch precursors. The etch precursors are delivered through precursor/gas inlets into a substrate processing region. In some implementations, the etch precursors may be mixed prior to introduction into the substrate processing region. In some implementations, etch precursors may be introduced into the substrate processing regions separately. The etch precursors may be excited by an inductively coupled plasma created by applying alternating current (AC) power to one or more inductive coils. The etch precursor includes a halogen-containing precursor, optionally a hydrogen-containing gas, and optionally an inert gas. In one implementation, the halogen-containing precursor is chlorine gas, the hydrogen-containing gas is hydrogen, and the optional inert gas is argon, helium, or both.

The halogen-containing precursor comprises a halogen or may comprise at least one element from chlorine, bromine, and iodine. The halogen-containing precursor may be a chlorine-containing gas. Exemplary chlorine-containing gases include diatomic chlorine ($Cl_2$). The inert gas may include at least one of argon, helium, neon, xenon and the like. In some implementations, the substrate-processing region may consist essentially of chlorine, hydrogen and an inert gas, chlorine and hydrogen, halogen and an inert gas, or chlorine, hydrogen and argon. The inclusion of the term "essentially" allows for other elemental concentrations, which may be unavoidably present in a typical processing system, as well as low concentrations, which do not adversely affect the silicon etching process.

Operation 120 includes applying energy to the halogen-containing precursor, the optional hydrogen-containing precursor and the optional inert gas if present to generate the radicals used to treat and etch the surfaces of the substrate. The plasma may be generated using known techniques (e.g., radio frequency excitations, capacitively-coupled power, inductively coupled power, and the like). In one implementation, the energy is applied using an inductively-coupled plasma power supply unit. The power is supplied to the inductive coils shown in cross-section in FIG. 3. The plasma power may be between about 25 watts and about 2500 watts (e.g., between about 50 watts and about 2000 watts, between about 50 watts and about 500 watts; between about 100 watts and about 400 watts, or between about 200 watts and about 300 watts). The pressure in the substrate processing region may be between about 0.5 mTorr and about 500 mTorr (e.g., between about 2 mTorr and about 200 mTorr or between about 5 mTorr and about 100 mTorr; or between about 10 mTorr and about 50 mTorr).

The RF frequency applied for either the local or remote plasmas described herein may be low RF frequencies less than about 200 kHz, high RF frequencies between about 10 MHz and about 15 MHz, or microwave frequencies greater than or about 1 GHz in embodiments.

The flow of the halogen-containing precursor may further include one or more relatively inert gases such as He, $N_2$, Ar. The inert gas can be used to improve plasma stability, process uniformity and the like. Argon is helpful, as an additive, to promote the formation of a stable plasma. Process uniformity is generally increased when helium is included. These additives are present in embodiments throughout this specification. Flow rates and ratios of the different gases may be used to control etch rates and etch selectivity.

In one implementation, the halogen-containing precursor (e.g. $Cl_2$) is supplied at a flow rate of between about 50 sccm (standard cubic centimeters per minute) and 2 slm (e.g., between about 100 sccm and about 1 slm; between about 100 sccm and 500 sccm; between about 200 sccm and 300 sccm). One of ordinary skill in the art would recognize that other gases and/or flows may be used depending on a number of factors including processing chamber configuration, substrate size, geometry and layout of features being etched, and the like. With regard to operation 120, the hydrogen-containing gas (e.g. $H_2$) may be supplied at a flow rate of between about 50 sccm (standard cubic centimeters per minute) and 2 slm (e.g., between about 100 sccm and about 1 slm; between about 100 sccm and 500 sccm; between about 200 sccm and 300 sccm). With further regard to operation 120, the inert gas (e.g. helium) may be supplied at a flow rate of between about 50 sccm (standard cubic centimeters per minute) and 2 slm (e.g., between about 100 sccm and about 1 slm; between about 100 sccm and 500 sccm; between about 200 sccm and 300 sccm). The temperature of the substrate may be between about −20 degrees Celsius and about 200 degrees Celsius (e.g., between about 0 degrees Celsius and about 100 degrees Celsius; between about 20 degrees Celsius and about 80 degrees Celsius) during operation 120.

In one implementation, the volumetric concentration of chlorine ($Cl_2$) in the etching process gas may be less than about 10%, or, more specifically less than about 5%, or even less than about 1% of the total volume of the etching process gas. In certain implementations, the volumetric concentration of chlorine in the etching process gas is between about 1% and about 10% of the total volume of the etching process gas.

In one implementation, the volumetric concentration of hydrogen ($H_2$) in the etching process gas may be less than about 10%, or, more specifically less than about 5%, or even less than about 1% of the total volume of the etching process gas. In certain implementations, the volumetric concentration of hydrogen in the etching process gas is between about 1% and about 10% of the total volume of the etching process gas.

In one implementation, after operation 120, the substrate is removed from the second processing chamber and transferred to a third processing chamber where operation 130 is performed. In one implementation, operation 130 is performed in a processing region of the third processing chamber. In one implementation, both the second processing chamber and the third processing chamber are positioned on a cluster tool allowing for transfer of the substrate from the second processing chamber to the third processing chamber without exposing the substrate to atmosphere (e.g., in a vacuum environment.) Not to be bound by theory, but it is believed that exposure of the chlorine terminated silicon-containing surface, which is the result of operation 120, to atmosphere (e.g., an oxygen-containing environment) causes the oxygen dose to increase 100 times on the chlorine terminated surface over a five minute period. As a result, it is preferable to perform operation 120 and 130 without exposing the silicon-containing surface to atmosphere.

Next, at operation 130, an epitaxial layer is deposited on the surface of the substrate. The surface of the substrate is contaminant free, which improves the quality of the epitaxial layer subsequently formed on the surface of the substrate. In one example, the epitaxial deposition may be a selective epitaxial deposition process performed at a temperature that is less than 800 degrees Celsius. In this example, the temperature is set such that it will not exceed 800 degrees Celsius, in order to limit the wafer thermal budget for delicate features that may distort or diffuse if overheated. In one embodiment, the epitaxial layer is deposited using a high temperature chemical vapor deposition (CVD) process. In this thermal CVD process, processing gases such as dichlorosilane, silane, disilane, germane, hydrogen chloride, or combinations thereof are used to deposit the epitaxial layer. The processing temperature is under 800 degrees Celsius and the processing pressure is between 5 and 600 Torr. When operations 110, 120 and 130 are performed, contaminants at interfaces have been reduced and the epitaxial layer formed is relatively defect-free.

The epitaxial layer may be a silicon-containing layer, a germanium-containing layer, a Group III-V, or a Group IV material. The epitaxial layer may be a binary film, ternary film, or quaternary film. Exemplary epitaxial layer materials include but are not limited to silicon, germanium, GaN, AlN, AlGaN, InGaN, InAlGaN, GaAs, $In_xAl_{1-x}As$, $In_xGa_{1-x}As$, InAs, Ge, $Si_{1-x}Ge_x$, SiC, Si:C, Si:CP, SiGe:C, SiGe:B, GeSn, GaSb, GaP, InP, AlSb, AlP, AlSbP, $MoSe_2$, $Ge_{(1-x)}Sn_x$, $Si_{(1-x-y)}Ge_xSn_y$, and combinations thereof, and may be undoped or doped with an n-type or p-type dopant element depending upon application, or modified for additional properties, e.g. insulation, wherein $0<x,y<1$ and $0<x+y<1$. In some implementations, the buffer layer is a material selected from the group consisting of: AlN, AlGaN, InGaN, InAlGaN, GaAs, InAlAs, Si, Ge, C, Sn, SiGe, SiC, GaSb, AlSb, GaP, AlP, InP, InSb, ZnO, $WSe_2$, $MoSe_2$, $Ge_{(1-x)}Sn_x$, $Si_{(1-x-y)}Ge_xSn_y$, and combinations thereof wherein $0<x,y<1$ and $0<x+y<1$. The epitaxial layer may be deposited using any suitable epitaxial deposition technique. Suitable epitaxial deposition techniques include metal organic chemical vapor phase epitaxy (MOVPE) processes, hydride vapor phase epitaxial (HVPE) processes, Atomic Layer Epitaxy (ALE) and/or any other suitable process.

In some implementations, the epitaxial layer is a silicon germanium (SiGe) layer. During this deposition process, a silicon precursor (e.g., dichlorosilane) flows concurrently into the processing chamber with a carrier gas (e.g., $H_2$ and/or $N_2$) and a germanium source (e.g., $GeH_4$). The flow rate of the silicon precursor may be in the range from about 5 sccm to about 1,000 sccm. The flow rate of the silicon precursor may be in the range from about 100 sccm to about 500 sccm. The flow rate of the carrier gas may be in the range from about 1,000 sccm to about 60,000 sccm. The flow rate of the carrier gas may be in the range from about 10,000 sccm to about 20,000 sccm. The flow rate of the germanium source may be in the range from about 10 sccm to about 200 sccm. The flow rate of the germanium source may be in the range from about 50 sccm to about 100 sccm. The processing chamber may be maintained with a pressure from about 0.1 Torr to about 200 Torr (e.g., from about 10 Torr to about 50 Torr; about 20 Torr). The substrate may be kept at a temperature in the range from about 400 degrees Celsius to about 1,000 degrees Celsius (e.g., from about 500 degrees Celsius to about 600 degrees Celsius). The reagent mixture is thermally driven to react and epitaxially deposit a silicon compound, namely a silicon germanium film on the substrate. The process is conducted to form the SiGe layer with a thickness in a range from about 100 Å to about 3,000 Å. The deposition rate may be between about 50 Å/min and about 600 Å/min (e.g., between about 100 Å/min and about 300 Å/min; about 150 Å/min). The germanium concentration is in the range from about 1 atomic percent to about 75 atomic percent of the SiGe compound (e.g., from about 50 atomic percent to about 70 atomic percent, about 65 atomic percent).

The silicon source is usually provided into the processing chamber at a rate within a range from about 40 sccm to about 1,000 sccm (e.g., from about 200 sccm to about 800 sccm; from about 500 sccm to about 600 sccm). Silicon sources that may be used for deposition of the strain relaxed buffer layer include silanes, halogenated silanes, organosilanes or derivatives thereof. Silanes include silane ($SiH_4$) and higher silanes with the empirical formula $Si_aH_{(2a+2)}$, such as disilane ($Si_2H_6$), trisilane ($Si_3H_8$) and tetrasilane ($Si_4H_{10}$), as well as others. Halogenated silanes include compounds with the empirical formula $X'_bSi_aH_{(2a+2-b)}$, where X' is independently selected from F, Cl, Br or I, such as hexachlorodisilane ($Si_2Cl_6$), tetrachlorosilane ($SiCl_4$), trichlorosilane ($Cl_3SiH$), dichlorosilane ($Cl_2SiH_2$) and chlorosilane (Cl-$SiH_3$). Organosilanes include compounds with the empirical formula $R_bSi_aH_{(2a+2-b)}$, where R is independently selected from methyl, ethyl, propyl or butyl, such as methylsilane (($CH_3$)$SiH_3$), dimethylsilane (($CH_3$)$_2SiH_2$), ethylsilane (($CH_3CH_2$)$SiH_3$), methyldisilane (($CH_3$)$Si_2H_5$), dimethyldisilane (($CH_3$)$_2Si_2H_4$) and hexamethyldisilane (($CH_3$)$_6Si_2$). In some implementations, the silicon sources include silane, dichlorosilane and disilane.

The germanium source gas may be provided at a rate of about 50 sccm to about 500 sccm (e.g., about 80 sccm to about 200 sccm; about 90 sccm to about 150 sccm; about 100 sccm). Germanium source gases may include one or more of germane ($GeH_4$), higher germanes, or chlorinated germanium derivatives, such as germanium dichloride ($GeCl_2$), germanium tetrachloride ($GeCl_4$), or dichlorogermane ($Cl_2GeH_2$). Higher germanes include compounds with the empirical formula $Ge_xH_{(2x+2)}$, such as digermane ($Ge_2H_6$), trigermane ($Ge_3H_8$) and tetragermane ($Ge_4H_{10}$), as well as others.

The carrier gas is usually provided into the processing chamber at a flow rate within a range from about 1 slm to about 100 slm (e.g., from about 5 slm to about 80 slm; from about 10 slm to about 40 slm; about 20 slm). Carrier gases may include nitrogen ($N_2$), hydrogen ($H_2$), argon, helium or combinations thereof. In one implementation, an inert carrier gas is used. The inert carrier gas includes nitrogen, argon, helium or combinations thereof. A carrier gas may be selected based on the precursor(s) used and/or the process temperature of the deposition process.

Figure 2:
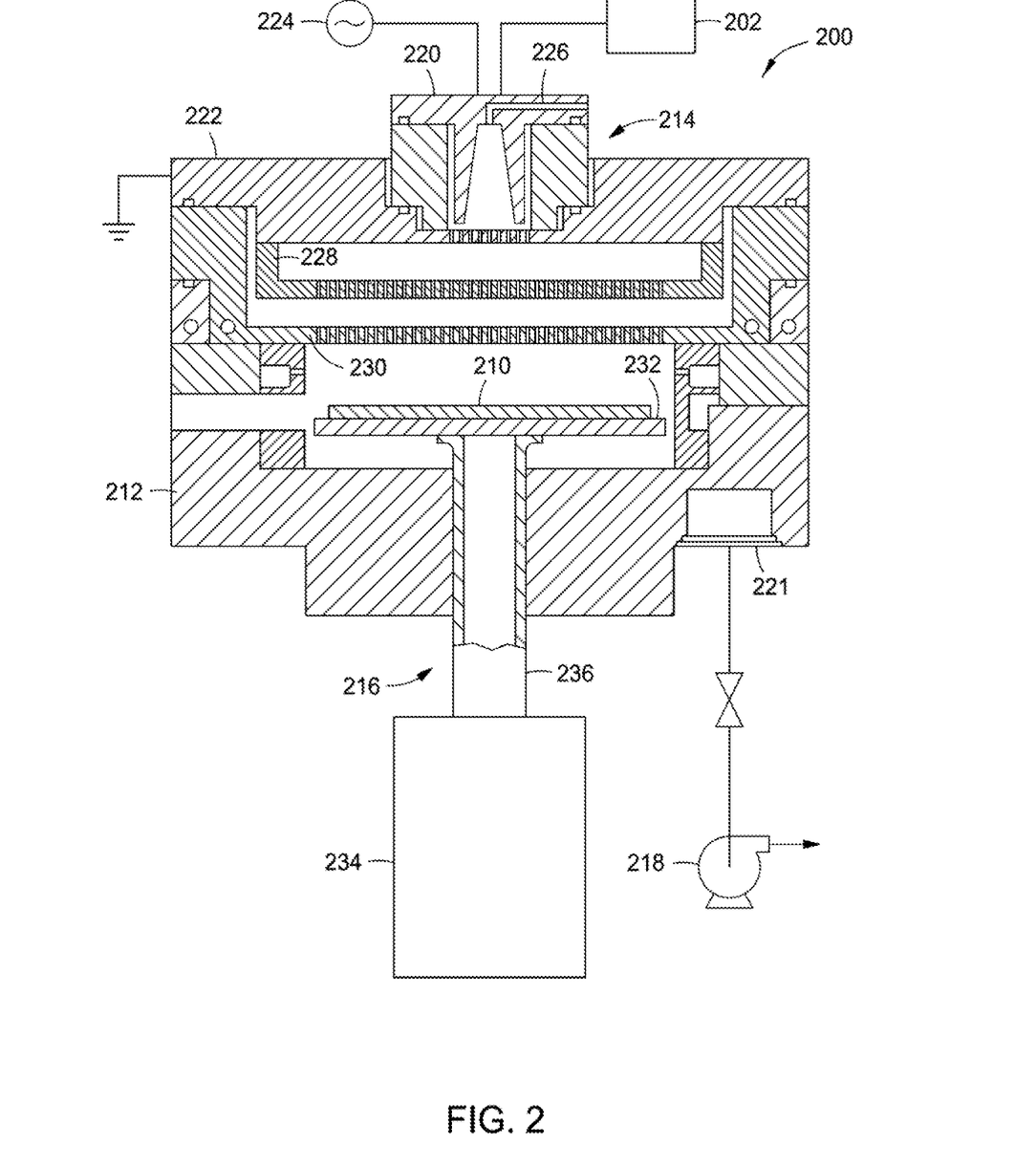
FIG. 2 is a cross sectional view of a cleaning chamber according to implementations described herein.

FIG. 2 is a schematic cross sectional view of a processing chamber 200 that may be adapted to perform operation 110. The processing chamber 200 may be a cleaning chamber. The processing chamber 200 may be particularly useful for performing a thermal or plasma-based oxidation process and/or a plasma assisted dry etch process. The processing chamber 200 includes a chamber body 212, a lid assembly 214, and a support assembly 216. The lid assembly 214 is disposed at an upper end of the chamber body 212, and the support assembly 216 is at least partially disposed within the chamber body 212. A vacuum system can be used to remove gases from processing chamber 200. The vacuum system includes a vacuum pump 218 coupled to a vacuum port 221 disposed in the chamber body 212.

The lid assembly 214 includes at least two stacked components configured to form a plasma volume or cavity there between. A first electrode 220 is disposed vertically above a second electrode 222 confining a plasma volume. The first electrode 220 is connected to a power source 224, such as a radio frequency (RF) power supply, and the second electrode 222 is connected to ground or a source return, forming a capacitance between the first electrode 220 and the second electrode 222. The lid assembly 214 also includes one or more gas inlets 226 for providing a cleaning gas to a substrate surface through blocker plate 228 and gas distribution plate 230. The cleaning gas may be an etchant or ionized active radical, such as ionized fluorine, chlorine, or ammonia, or an oxidizing agent, such as ozone. Additionally, the processing chamber 200 includes a controller 202 for controlling processes within the processing chamber 200.

The support assembly 216 may include a substrate support 232 to support a substrate 210 thereon during processing. The substrate support 232 may be coupled to an actuator 234 by a shaft 236, which extends through a centrally-located opening formed in a bottom surface of the chamber body 212. The actuator 234 may be flexibly sealed to the chamber body 212 by bellows (not shown) that prevent vacuum leakage from around the shaft 236. The actuator 234 allows the substrate support 232 to be moved vertically within the chamber body 212 between a process position and a lower, transfer position. The transfer position is slightly below the opening of a slit valve formed in a sidewall of the chamber body 212.

The substrate support 232 has a flat, or a substantially flat, surface for supporting a substrate to be processed thereon. The substrate support 232 may be moved vertically within the chamber body 212 by actuator 234 coupled thereto by shaft 236. In operation, the substrate support 232 may be elevated to a position in close proximity to the lid assembly 214 to control the temperature of the substrate 210 being processed. As such, the substrate 210 may be heated via radiation emitted or convection from the gas distribution plate 230.

A different cleaning process may be utilized to clean the substrate surface. In one embodiment, a remote plasma containing He and $NF_3$ is introduced into a processing chamber through a gas distribution plate, such as a showerhead. $NH_3$ is directly injected into the chamber via a separate gas inlet.

In one example of processing sequence 100, the clean process (operation 110) may be performed in the SiCoNi™ cleaning chamber, available from Applied Materials, Inc. of Santa Clara, Calif. Chambers available from other manufacturers may also be used to practice implementations described herein. In one implementation, both operations 110 and 120 may be performed in a single processing chamber, such as one of the chambers shown in FIGS. 2-3. In one implementation, both operations 110 and 120 are performed in a SiCoNi™ cleaning chamber.

Figure 3:
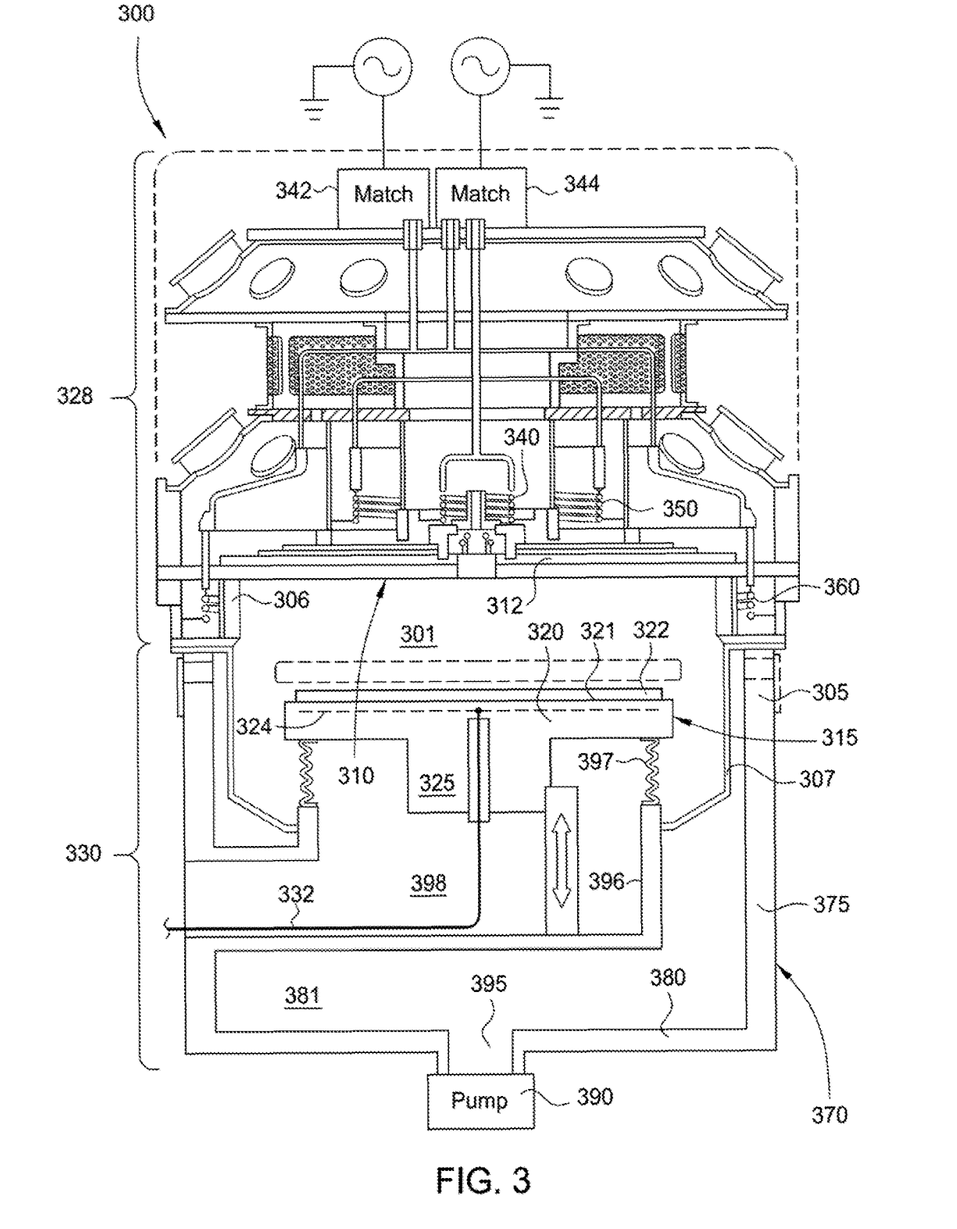
FIG. 3 is a cross-sectional view of a processing chamber according to implementations described herein.

FIG. 3 is a cross sectional view of a plasma processing chamber 300 according to implementations described herein. The plasma processing chamber 300 depicted in FIG. 3 includes an upper portion 328 and a lower portion 330. The plasma-processing chamber 300 has a sidewall 305 and a lid assembly 310. The sidewall 305 has an axially symmetrical shape, such as a cylinder. The sidewall 305 includes an axially symmetrical (e.g., cylindrical) dielectric side window 306 and a chamber liner 307, which may be formed of metal. A substrate support 315 inside the plasma processing chamber 300 includes a pedestal 320 having a substrate support surface 321 facing the lid assembly 310 for holding a substrate 322, and a post 325 supporting the pedestal 320. The lid assembly 310, the pedestal 320 and the sidewall 305 confine a processing region 301 of the plasma-processing chamber 300. The pedestal 320 may include an insulated internal electrode 324. Optionally, an electrostatic chucking (ESC) voltage and/or RF plasma bias power may be supplied to the insulated internal electrode 324 via a cable 332 extending through the post 325. The cable 332 may be coupled to an RF bias power source (such as an RF impedance matching network and/or an RF power generator) as an RF bias feed to the insulated internal electrode 324. The cable 332 and may be provided as a coaxial transmission line, which may be rigid (or flexible), or as a flexible coaxial cable.

Plasma source power is inductively coupled into the processing region 301 by a set of coil antennas. The set of coil antennas includes an inner coil antenna 340, a middle coil antenna 350 and optionally an outer or side coil antenna 360, all of which are concentrically disposed with respect to each other and are coaxial with the axis of symmetry of the sidewall 305. The lid assembly 310 includes a disk-shaped dielectric window through which the inner and middle coil antennas 340 and 350 inductively couple RF plasma source power into the processing region 301. The disk-shaped dielectric window 312 is coaxial with the sidewall 305 and has a disk-plane parallel with the plane of the substrate support surface 321. The side coil antenna 360 inductively couples RF plasma source power into the processing region 301 through the dielectric side window 306. The dielectric windows 306 and 312 may be referred to collectively as a window assembly.

The chamber liner 307 is enclosed within a lower chamber body 370 including a cylindrical lower chamber body sidewall 375 and a lower chamber body floor 380. The cylindrical lower chamber body sidewall 375 and the lower chamber body floor 380 enclose an evacuation region 381. A vacuum pump 390 is disposed in a vacuum pump opening 395 in the lower chamber body floor 380 and is centered relative to the axis of symmetry of the cylindrical lower chamber body sidewall 375. A containment wall 396 coaxial with the substrate support 315 and a flexible bellows 397 extending between the pedestal 320 and the containment wall 396 enclose the substrate support 315 in an internal central space 398. The internal central space 398 is isolated from the volume evacuated by the vacuum pump 390, including the evacuation region 381 and the processing region 301.

The power may be supplied from a common RF source or from different RF sources such as RF matches (RF impedance matching networks) 342 and 344. An RF impedance matching network may be employed having dual outputs in order to drive two of the coil antennas with a first RF generator, while a second RF generator and a second RF impedance matching network drives the third coil antenna. Alternatively, three RF generators may separately drive the three coil antennas through three respective RF impedance matching networks. In yet another embodiment, a single RF power generator may drive all three coil antennas through an RF impedance matching network having three outputs. In some implementations of the foregoing embodiments, the RF power levels applied to the different coil antennas may be separately adjusted in order to control radial distribution of plasma ion density. While described embodiments include the three coil antennas 340, 350 and 360, other embodiments may include only one or two of the three described coil antennas 340, 350 and 360.

Next, at operation 130, after the etching process is performed, an epitaxial silicon layer may be formed on the surface of the substrate as describe herein. The surface of the substrate is contaminant free, which improves the quality of the epitaxial layer subsequently formed on the surface of the substrate. In one example, the epitaxial deposition may be a selective epitaxial deposition process performed at a temperature that is less than 800 degrees Celsius. In this example, the temperature is set such that it will not exceed 800 degrees Celsius, in order to limit the wafer thermal budget for delicate features that may distort or diffuse if overheated. In one embodiment, the epitaxial layer is deposited using a high temperature chemical vapor deposition (CVD) process. In this thermal CVD process, processing gases such as dichlorosilane, silane, disilane, germane, hydrogen chloride, or combinations thereof are used to deposit the epitaxial layer. The processing temperature is under 800 degrees Celsius and the processing pressure is between 5 and 600 Torr. When operations 120 and 130 are performed, contaminants at interfaces have been reduced and the epitaxial layer formed is relatively defect-free.

Figure 4:
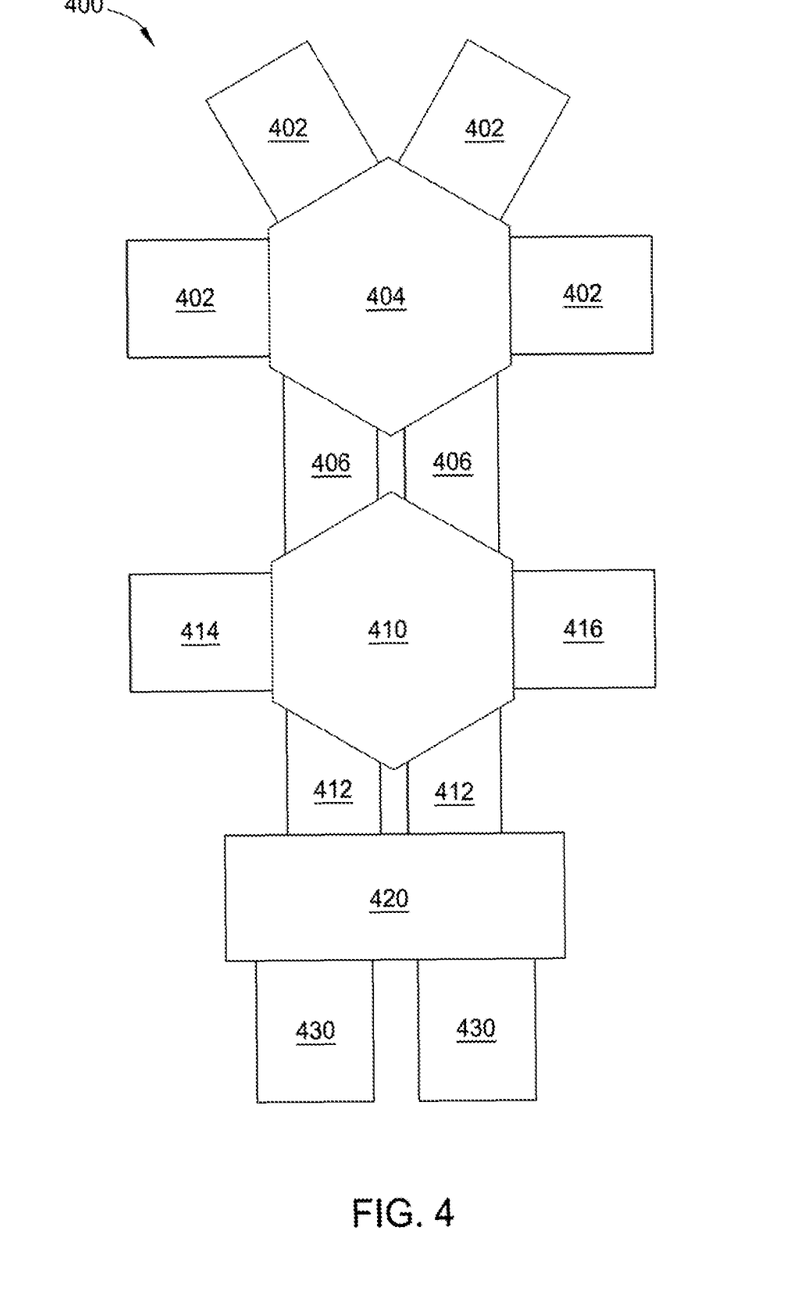
FIG. 4 is a schematic top view of a processing system that can be used to complete the processing sequence illustrated in FIG. 1 according to implementations described herein.

FIG. 4 illustrates a processing system 400 that can be used to complete the processing sequence 100 illustrated in FIG. 1, according to implementations of the disclosure. One example of the processing system 400 is the ENDURA® system available from Applied Materials, Inc., of Santa Clara, Calif. As shown in FIG. 4, a plurality of processing chambers 402 is coupled to a first transfer chamber 404. The first transfer chamber 404 is also coupled to a first pair of processing chambers 406. The first transfer chamber 404 has a centrally disposed transfer robot (not shown) for transferring substrates between the processing chambers 406 and the processing chambers 402. The processing chambers 406 are coupled to a second transfer chamber 410, which is coupled to a cleaning chamber 414 for cleaning the substrate (operation 110) and an etching chamber 416 for etching the substrate (operation 120). The cleaning chamber 414 may be similar to processing chamber 200 depicted in FIG. 2. The etching chamber 416 may be similar to plasma processing chamber 300 depicted in FIG. 3. The second transfer chamber 410 has a centrally disposed transfer robot (not shown) for transferring substrates between a set of load-lock chambers 412 and the cleaning chamber 414 or the etching chamber 416. A factory interface 420 is connected to the second transfer chamber 410 by the load-lock chambers 412. The factory interface 420 is coupled to one or more pods 430 on the opposite side of the load-lock chambers 412. The pods 430 typically are front opening unified pods (FOUP) that are accessible from the clean room.

During operation, a substrate is first transferred to the cleaning chamber 414 where a cleaning process is performed to remove contaminants such as carbon or hydrocarbons from the substrate surface, breakthrough oxides formed on the surface of the substrate, or both. The cleaning process is described in FIG. 1 under operation 110. Then the substrate is transferred to the etching chamber 416 in which operation 120 is performed.

The etched substrate is then transferred to one or more processing chambers 402 in which the epitaxial deposition, as described under operation 130 is performed. Because all three operations 110, 120 and 130 are performed within the same processing system, vacuum is not broken as the substrate is transferred to various chambers, which decreases the chance of contamination and improves the quality of the deposited epitaxial film.

Figure 5:
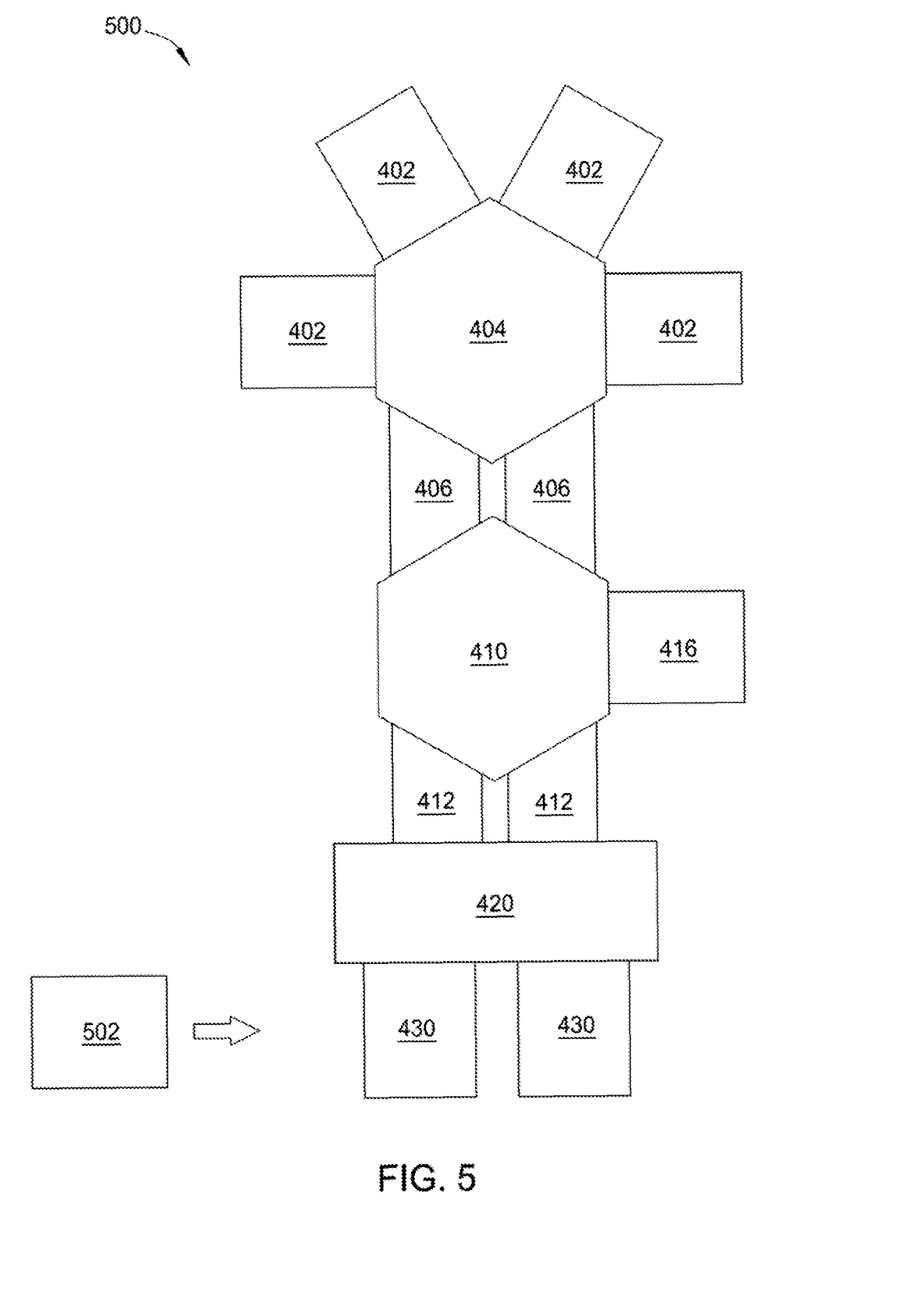
FIG. 5 is a schematic top view of another processing system that can be used to complete the processing sequence illustrated in FIG. 1 according to implementations described herein.

FIG. 5 is a schematic top view of another processing system 500 that can be used to complete the processing sequence illustrated in FIG. 1 according to implementations described herein. In another implementation, operation 110 is performed in a processing chamber 502 that is not a part of the processing system that contains the etching chamber 416 and the one or more processing chambers 402. As shown in FIG. 5, the substrate surface is cleaned in a processing chamber 502. The substrate is then transferred to the processing system 500, which is the processing system 400 without the cleaning chamber 414. The substrate is transferred to the etching chamber 416 in which operation 120 is performed. Then the substrate is transferred to at least one of the processing chambers 402 in which operation 130 is performed.

Figure 6:
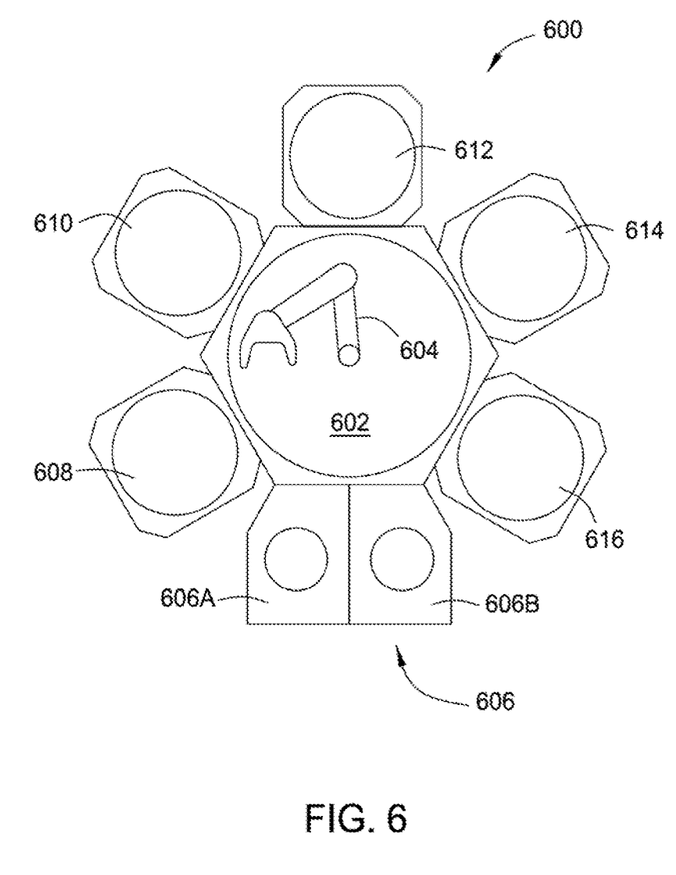
FIG. 6 is a schematic top view of another processing system that can be used to complete the processing sequence illustrated in FIG. 1 according to implementations described herein.

FIG. 6 is a schematic top view of another processing system 600 that can be used to complete the processing sequence illustrated in FIG. 1 according to implementations described herein. One example of the processing system 600 is the CENTURA® system available from Applied Materials, Inc., of Santa Clara, Calif. A transfer robot 604 of any convenient type is disposed in a transfer chamber 602 of the processing system 600. A load-lock 606, with two load-lock chambers 606A, 606B is coupled to the transfer chamber 602. A plurality of processing chambers 608, 610, 612, 614, 616 are also coupled to the transfer chamber 602. The plurality of processing chambers 608, 610, 612, 614, 616 may include at least one of a cleaning chamber, an etching chamber and deposition chambers, such as an epitaxial deposition chamber.

Processing chamber 608 may be a cleaning chamber configured to clean the substrate (operation 110) prior to deposition. The processing chamber 608 may be configured to perform the Applied Materials SICONI™ Preclean process. The processing chamber 608 may be similar to processing chamber 200 depicted in FIG. 2. The processing chamber 608 may be an etching chamber for etching the substrate (operation 120). The processing chamber 608 may be similar to plasma processing chamber 300 depicted in FIG. 3. Processing chambers 610, 612, 614 may be a material deposition chamber such as an epitaxial deposition chamber capable of performing an epitaxial growth process.

The processing system 600 may be used to perform the processing sequence 100 described above. During processing, a substrate that is to be processed may arrive to the processing system 600 in a pod (not shown). The substrate is transferred from the pod to the vacuum compatible load-lock 606A, 606B by the factory interface robot (not shown). The substrate is then handled by the transfer robot 604 in the transfer chamber 602, which is generally kept in a vacuum state. The transfer robot 604 then loads the substrate into the processing chamber 608 for cleaning as described in operation 110. The transfer robot 604 then picks up the substrate from the processing chamber 608 and loads the substrate into the processing chamber 616 for etching as described in operation 120. The transfer robot 604 then picks up the substrate from the processing chamber 608 and loads the substrate into the processing chamber 610, 612, whichever is available, for material deposition. An epitaxial layer may be grown on the cleaned substrate in the processing chamber 610, 612, and 614 as described in operation 130.

Figure 7:
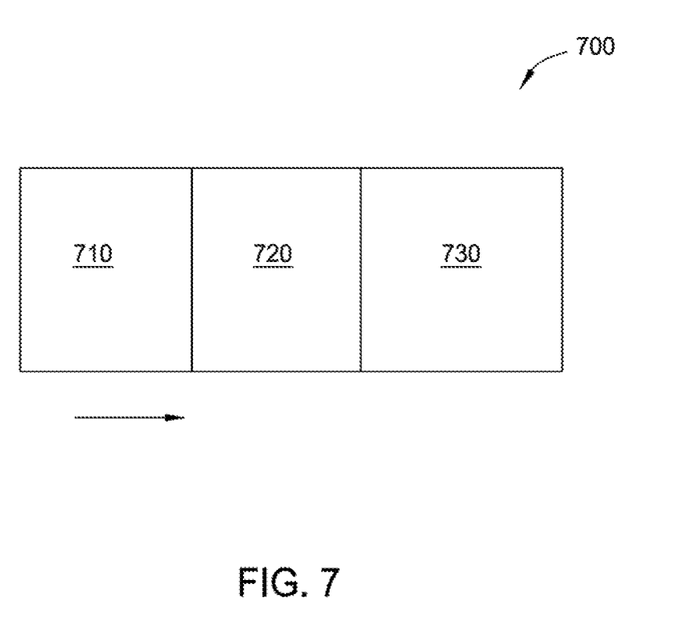
FIG. 7 is a schematic top view of another processing system that can be used to complete the processing sequence illustrated in FIG. 1 according to implementations described herein.

FIG. 7 is a schematic view of another processing system 700 that can be used to complete the processing sequence illustrated in FIG. 1 according to implementations described herein. As shown in FIG. 7, the processing system 700 is a linear processing system with the processing chambers 710, 720, 730 arranged in sequential order. The processing system 700 has a transport system capable of moving the substrate through the processing regions of the various processing chamber. In one implementation, the transport system comprises one or more robots capable of transferring the substrate. In another implementation, the transport system comprises a common transport architecture. The common transport architecture may comprise a track system, which extends through the processing region or discrete processing regions and is configured to transport either a web substrate or discrete substrates.

Processing chamber 710 is a cleaning chamber for cleaning the substrate (operation 110). Processing chamber 710 may be similar to processing chamber 200 depicted in FIG. 2. Processing chamber 720 is an etching chamber for etching the substrate (operation 120). Processing chamber 720 may be similar to plasma processing chamber 300 depicted in FIG. 3. Processing chamber 730 is an epitaxial deposition chamber for deposition of materials onto the substrate (operation 130). Other components of the processing system 700 are not depicted for the sake of simplicity.

During operation, a substrate is first transferred to the processing chamber 710 where a cleaning process is performed to remove contaminants such as carbon or hydrocarbons from the substrate surface, breakthrough oxides formed on the surface of the substrate, or both. The cleaning process is described in FIG. 1 under operation 110. Then the substrate is transferred to the processing chamber 720 in which operation 120 is performed.

The etched substrate is then transferred to processing chamber 730 in which the epitaxial deposition, as described under operation 130 is performed. Because all three operations 110, 120, 130 are performed within the same processing system, vacuum is not broken as the substrate is transferred to various chambers, which decreases the chance of contamination and improves the quality of the deposited epitaxial film.

The transfer chambers may remain under vacuum and/or at a pressure below atmosphere during the process. The vacuum level of the transfer chambers may be adjusted to match the vacuum level of corresponding processing chambers. For example, when transferring a substrate from a transfer chamber into a processing chamber (or vice versa), the transfer chamber and the processing chamber may be maintained at the same vacuum level. Then, when transferring a substrate from the transfer chamber to the load lock chamber or batch load lock chamber (or vice versa), the transfer chamber vacuum level may match the vacuum level of the loadlock chamber or batch load lock chamber even through the vacuum level of the loadlock chamber or batch load lock chamber and the processing chamber may be different. Thus, the vacuum level of the transfer chamber may be adjusted. In certain implementations, it may be desirable to backfill the transfer chamber with an inert gas such as nitrogen. In one implementation, the substrate is transferred in an environment having greater than 90% $N_2$. In certain implementations, the substrate is transferred in a high purity $NH_3$ environment. In one implementation, the substrate is transferred in an environment having greater than 90% $NH_3$. In certain implementations, the substrate is transferred in a high purity $H_2$ environment. In one implementation, the substrate is transferred in an environment having greater than 90% $H_2$.

It should be understood that the operations 110, 120, 130 of the processing sequence 100 may be performed using a series of stand-alone processing chamber. In implementations where stand-alone processing chambers are used, the queue time between operations is managed to prevent some adverse effect on the fabricated device's performance. Queue time is generally defined as the time a substrate can be exposed to the atmospheric or other contaminants after a first process has been completed on the substrate before a second process is completed on the substrate to prevent some adverse effect on the fabricated device's performance. For example, in some implementations, the queue time between any of the operations 110, 120,130 may be between 1 hour and 12 hours (e.g., between 8 to 12 hours; between 2 to 3 hours).

In implementations, where the operations 110, 120, 130 are performed in stand-alone chambers, the substrate may be transferred between chambers in a separate carrier (not shown) in which an inert atmosphere (e.g., nitrogen environment) is maintained.

In summary, some of the benefits of the present disclosure provide methods of pre-cleaning a silicon-containing substrate prior to epitaxial deposition, which results in epitaxial deposition of an improved epitaxial material. It has been found by the inventors that clustering processing chambers through vacuum transfer reduces exposure to atmosphere and correspondingly reduces exposure to oxygen contaminants. For example, performing inductively coupled plasma chlorine etching of silicon prior to epitaxial deposition without breaking vacuum between etching and deposition reduces exposure to oxygen contaminants. In some implementations, a native oxide removal process is performed followed by a silicon-etching process and an epitaxial deposition process. Since most native oxide removal processes are unstable and native oxide starts regrowing on the silicon-containing surface upon exposure to atmosphere, clustering the native oxide removal chamber along with the etching of silicon and epitaxial deposition also leads to a reduction in oxygen contaminants.

When introducing elements of the present disclosure or exemplary aspects or implementation(s) thereof, the articles "a," "an," "the" and "said" are intended to mean that there are one or more of the elements.

While the foregoing is directed to implementations of the present disclosure, other and further implementations of the disclosure may be devised without departing from the basic scope thereof, and the scope thereof is determined by the claims that follow.

The invention claimed is:

1. A method of processing a substrate, comprising:
etching a surface of a silicon-containing substrate positioned in a substrate-processing region by use of a plasma etch process, wherein at least one etching process gas comprising chlorine gas, hydrogen gas, and an inert gas is used during the plasma etch process; and
forming an epitaxial layer on the surface of the silicon-containing substrate, wherein the inert gas is selected from argon, helium, or both.

2. The method of claim 1, wherein the plasma etch process utilizes an inductively coupled plasma etch process.

3. The method of claim 2, wherein the inductively coupled plasma etch process includes forming an inductively coupled plasma by applying alternating current (AC) power to one or more inductive coils.

4. The method of claim 1, wherein the etching a surface of a silicon-containing substrate and the forming an epitaxial layer on the surface of the silicon-containing substrate are performed without exposing the silicon-containing substrate to atmosphere.

5. The method of claim 1, wherein a volumetric concentration of the chlorine gas is between about 1% and about 10% of a total volume of the at least one etching process gas.

6. The method of claim 1, wherein the chlorine gas and the hydrogen gas are introduced separately into the substrate-processing region.

7. A method of processing a substrate, comprising:
removing oxides from a surface of a silicon-containing substrate positioned in a first substrate-processing region by a cleaning process, wherein the cleaning process is selected from a wet etch process, a first plasma etch process, and a sputter etch process;
etching the surface of the silicon-containing substrate positioned in a second substrate-processing region by use of a second plasma etch process, wherein at least one etching process gas comprising chlorine gas, hydrogen gas, and an inert gas is used during the second plasma etch process; and
forming an epitaxial layer on the surface of the silicon-containing substrate, wherein the inert gas is selected from argon, helium, or both.

8. The method of claim 7, wherein the cleaning process is the first plasma etch process and the first plasma etch process comprises simultaneous exposure of the surface of the silicon-containing substrate to $NF_3$ and $NH_3$ plasma by-products.

9. The method of claim 8, wherein the first plasma etch process is a remote capacitively coupled plasma etch process.

10. The method of claim 8, wherein the first plasma etch process is an inductively coupled plasma etch process.

11. The method of claim 10, wherein the inductively coupled plasma etch process includes forming an inductively coupled plasma by applying alternating current (AC) power to one or more inductive coils.

12. The method of claim 7, wherein the etching the surface of the silicon-containing substrate and the forming an epitaxial layer on the surface of the silicon-containing substrate are performed without exposing the silicon-containing substrate to atmosphere.

13. The method of claim 7, wherein a volumetric concentration of the chlorine gas is between about 1% and about 10% a total volume of the at least one etching process gas.

14. The method of claim 7, wherein the chlorine gas and the hydrogen gas are introduced separately into the second substrate-processing region.

15. A method of processing a substrate, comprising:
  etching a surface of a silicon-containing substrate positioned in a substrate-processing region of a first processing chamber by use of a plasma etch process, wherein at least one etching process gas comprising chlorine gas, hydrogen gas, and an inert gas is used during the plasma etch process;
  transferring the silicon-containing substrate from the first processing chamber to a second processing chamber after the plasma etch process without exposing the silicon-containing substrate to atmosphere; and
  forming an epitaxial layer on the surface of the silicon-containing substrate in the second processing chamber, wherein the inert gas is selected from argon, helium, or both.

16. The method of claim 15, wherein the plasma etch process utilizes an inductively coupled plasma etch process.

17. The method of claim 16, wherein the inductively coupled plasma etch process includes forming an inductively coupled plasma by applying alternating current (AC) power to one or more inductive coils.

18. The method of claim 15, further comprising removing oxides from the surface of the silicon-containing substrate in a third processing chamber prior to the etching a surface of a silicon-containing substrate, by a cleaning process, wherein the cleaning process is selected from a wet etch process, a first plasma etch process, and a sputter etch process.

19. The method of claim 18, further comprising transferring the silicon-containing substrate from the third processing chamber to the first processing chamber after the cleaning process without exposing the silicon-containing substrate to atmosphere between the cleaning process and the etching a surface of a silicon-containing substrate.

20. The method of claim 15, wherein the chlorine gas and the hydrogen gas are introduced separately into the substrate-processing region.

\* \* \* \* \*